United States Patent
Takashima et al.

(10) Patent No.: US 10,393,814 B2
(45) Date of Patent: Aug. 27, 2019

(54) SECONDARY BATTERY STATE DETECTION DEVICE AND SECONDARY BATTERY STATE DETECTION METHOD

(71) Applicants: FURUKAWA ELECTRIC CO., LTD., Tokyo (JP); FURUKAWA AUTOMOTIVE SYSTEMS INC., Shiga (JP)

(72) Inventors: Naoya Takashima, Tokyo (JP); Noriyasu Iwane, Tokyo (JP); Koichi Yokoyama, Tokyo (JP)

(73) Assignees: FURUKAWA ELECTRIC CO., LTD., Tokyo (JP); FURUKAWA AUTOMOTIVE SYSTEMS INC., Shiga (JP)

( * ) Notice: Subject to any disclaimer, the term of this patent is extended or adjusted under 35 U.S.C. 154(b) by 227 days.

(21) Appl. No.: 14/995,915
(22) Filed: Jan. 14, 2016

(65) Prior Publication Data

US 2016/0131716 A1 May 12, 2016

Related U.S. Application Data

(63) Continuation of application No. PCT/JP2014/067596, filed on Jul. 1, 2014.

(30) Foreign Application Priority Data

Jul. 15, 2013 (JP) ................................. 2013-147175

(51) Int. Cl.
G01R 31/367 (2019.01)
G01R 31/3842 (2019.01)
(Continued)

(52) U.S. Cl.
CPC ....... *G01R 31/367* (2019.01); *G01R 31/3842* (2019.01); *H01M 10/48* (2013.01);
(Continued)

(58) Field of Classification Search
CPC .................. G01R 31/3624; G01R 31/3651
See application file for complete search history.

(56) References Cited

U.S. PATENT DOCUMENTS

| 5,561,362 A * | 10/1996 | Kawamura | G01R 31/3624 320/134 |
| 6,435,294 B1 * | 8/2002 | Hara | B60K 6/48 180/65.25 |
| 2002/0003417 A1 * | 1/2002 | Bito | B60K 6/48 320/152 |
| 2002/0145430 A1 * | 10/2002 | Arai | B60K 6/22 324/426 |

(Continued)

FOREIGN PATENT DOCUMENTS

| JP | 2007174865 A | 7/2007 |
| JP | 2007187534 A | 7/2007 |

(Continued)

OTHER PUBLICATIONS

International Search Report dated Sep. 9, 2014 for PCT Application No. PCT/JP2014/067596, 2 pages.

*Primary Examiner* — Michael J Dalbo
(74) *Attorney, Agent, or Firm* — Amin, Turocy & Watson, LLP (57) ABSTRACT

[Object] To accurately detect states of a variety of types of secondary batteries even in a low-current range.
[Solution] A secondary battery state detecting device includes: a current detecting unit (a current sensor (12)) that detects a value of a current flowing in a secondary battery (14); a calculating unit (an equivalent circuit component calculation module (114)) that calculates an equivalent circuit component that constitutes an equivalent circuit of the secondary battery; an estimating unit (a voltage drop value calculation module (116)) that estimates a value of a voltage drop caused by a value of a dark current on the basis of the value of the dark current and the equivalent circuit component, the value of the dark current corresponding to a value of a current detected by the current detecting unit and the dark current flowing in the secondary battery after the vehicle has stopped, and the equivalent circuit component (Continued)

corresponding to the equivalent circuit component calculated by the calculating unit and having an element value varying nonlinearly in accordance with the value of the dark current; and a state detecting unit (an open circuit voltage calculation module (118)) that detects a state of the secondary battery on the basis of the value of the voltage drop estimated by the estimating unit.

20 Claims, 9 Drawing Sheets

(51) Int. Cl.
    *H01M 10/48*      (2006.01)
    *G01R 31/389*      (2019.01)
    *H02J 7/00*      (2006.01)

(52) U.S. Cl.
    CPC ......... *G01R 31/389* (2019.01); *H01M 10/486* (2013.01); *H01M 2220/20* (2013.01); *H02J 7/0021* (2013.01)

(56) References Cited

U.S. PATENT DOCUMENTS

| | | | |
|---|---|---|---|
| 2002/0171429 A1* | 11/2002 | Ochiai | G01R 31/3675 324/426 |
| 2007/0145948 A1* | 6/2007 | Lim | B60L 11/1887 320/132 |
| 2009/0027007 A1* | 1/2009 | Iwane | G01R 31/3651 320/129 |
| 2010/0121591 A1* | 5/2010 | Hall | G01R 31/3624 702/63 |
| 2012/0029852 A1* | 2/2012 | Goff | G01R 31/3679 702/63 |
| 2012/0221267 A1* | 8/2012 | Takahashi | H01M 10/42 702/63 |

FOREIGN PATENT DOCUMENTS

| | | | |
|---|---|---|---|
| JP | 2010025563 A | | 2/2010 |
| JP | 20100025563 A | * | 2/2010 |
| WO | 2009118910 A1 | | 10/2009 |
| WO | 2012046265 A1 | | 4/2012 |

* cited by examiner

SECONDARY BATTERY STATE DETECTION DEVICE AND SECONDARY BATTERY STATE DETECTION METHOD

CROSS-REFERENCE TO RELATED APPLICATIONS

The subject application is a continuation of, and claims priority to, PCT Application Serial No. PCT/JP2014/067596, filed Jul. 1, 2014, and entitled "SECONDARY BATTERY STATE DETECTION DEVICE AND SECONDARY BATTERY STATE DETECTION METHOD", which claims priority to Japanese Patent Application Serial No. 2013-147175, filed Jul. 15, 2013, the disclosures of which are incorporated herein by reference in their entirety.

TECHNICAL FIELD

The present invention relates to secondary battery state detecting devices and secondary battery state detecting methods.

BACKGROUND ART

Patent Document 1 discloses an open voltage estimating apparatus including means for detecting a battery (secondary battery) voltage and means for detecting a battery current flowing to a vehicle load, where the apparatus has a function for using a map to estimate dark current produced by the vehicle load and the operation of a battery monitoring apparatus, and a voltage drop at each of battery charge states and battery temperatures resulting therefrom, and estimate an open voltage using this correction voltage in addition to a detected voltage.

Further, Patent Document 2 discloses a technique in which, in a secondary battery state detecting method and state detecting device that carry out state detection of a secondary battery with high accuracy by correcting a voltage change caused by a dark current, a correlation between a dark current value and a voltage correction value is prepared in advance as a correlation function, and in the case where the correlation varies due to a state of charge, a temperature, or the like of the secondary battery, at least one of the state of charge and the temperature is included as a variable in a linear correlation function.

In addition, Patent Document 3 discloses a battery discharge capacity determination method that can determine a battery discharge capacity by setting at least tuning parameters of an equivalent circuit and a state vector that takes a predetermined function of the tuning parameters as an element, taking a measured current value and voltage value and an SOC calculated through a predetermined SOC calculating method as observed values, estimating the state vector from the observed values, and then applying the tuning parameters serving as the element of the estimated state vector to the equivalent circuit and estimating a response voltage in response to a requested load current occurring during discharge using a predetermined current pattern.

CITATION LIST

Patent Literature

Patent Document 1: Japanese Unexamined Patent Application Publication No. 2007-174865A Patent Document 2: Japanese Unexamined Patent Application Publication No. 2010-25563A Patent Document 3: Japanese Unexamined Patent Application Publication No. 2007-187534A

SUMMARY OF INVENTION

Technical Problem

Incidentally, the techniques disclosed in Patent Documents 1 and 2 have problems in that in order to handle a variety of secondary batteries, it is necessary to prepare a correction voltage map or a correction correlation function for each type of secondary battery or each of degradation states. Meanwhile, the technique disclosed in Patent Document 3 has a problem in that error increases in a low-current range.

An object of the present invention is to provide a secondary battery state detecting device and a secondary battery state detecting method capable of accurately detecting states of a variety of types of secondary batteries, even in a low-current range.

Solution to Problem

To solve the above-described problems, a secondary battery state detecting device according to the present invention detects a state of a secondary battery installed in a vehicle, and includes: a current detecting unit that detects a value of a current flowing in the secondary battery; a calculating unit that calculates an equivalent circuit component that constitutes an equivalent circuit of the secondary battery; an estimating unit that estimates a value of a voltage drop caused by a value of a dark current on the basis of the value of the dark current and the equivalent circuit component, the value of the dark current corresponding to a value of a current detected by the current detecting unit and a current that flows in the secondary battery after the vehicle has stopped, and the equivalent circuit component corresponding to the equivalent circuit component calculated by the calculating unit and having an element value varying nonlinearly in accordance with the value of the dark current; and a state detecting unit that detects a state of the secondary battery on the basis of the value of the voltage drop estimated by the estimating unit.

According to this configuration, states of a variety of types of secondary batteries can be accurately detected even in a low-current range.

According to an aspect of the present invention, the equivalent circuit component includes at least a reaction resistance.

According to this configuration, the state of the secondary battery can be accurately detected taking into consideration the influence of the reaction resistance having an element value varying nonlinearly in accordance with the dark current value.

According to another aspect of the present invention, the equivalent circuit component includes at least one of a conductive resistance and an electric double layer capacity.

According to this configuration, the state of the secondary battery can be accurately detected taking into consideration the influence of at least one of the conductive resistance and the electric double layer capacity both having element values vary nonlinearly in accordance with the dark current value.

According to another aspect of the present invention, the estimating unit expresses the equivalent circuit component having an element value varying nonlinearly in accordance with the dark current value using an exponential function that takes the value of the current as a parameter.

According to this configuration, expressing the nonlinear variation in the equivalent circuit component based on the dark current value using an exponential function makes it possible to easily and accurately detect the state of the secondary battery.

According to another aspect of the present invention, the estimating unit expresses the equivalent circuit component having an element value varying nonlinearly in accordance with the dark current value using a logarithmic function that takes the value of the current as a parameter.

According to this configuration, expressing the nonlinear variation in the equivalent circuit component based on the dark current value using a logarithmic function makes it possible to easily and accurately detect the state of the secondary battery.

According to another aspect of the present invention, the equivalent circuit component is corrected using at least one fluctuation factor of the secondary battery.

According to this configuration, the state of the secondary battery can be accurately detected taking into consideration the fluctuation factor.

According to another aspect of the present invention, the value of the voltage drop caused by the dark current is corrected using at least one fluctuation factor of the secondary battery.

According to this configuration, the value of the voltage drop is corrected on the basis of the fluctuation factor, and thus a more accurate voltage drop value can be found.

According to another aspect of the present invention, the equivalent circuit component and the value of the voltage drop caused by the dark current are corrected using at least one fluctuation factor of the secondary battery.

According to this configuration, correcting the equivalent circuit component and the value of the voltage drop caused by the dark current using at least one fluctuation factor of the secondary battery makes it possible to find a more accurate voltage drop value.

According to another aspect of the present invention, the fluctuation factor includes at least one of a temperature, a charge state, and a stratification voltage of the secondary battery.

According to this configuration, the state of the secondary battery can be accurately detected taking into consideration the temperature, the charge state, and the stratification voltage, which are fluctuation factors.

A secondary battery state detecting method according to the present invention detects a state of a secondary battery installed in a vehicle, and includes: a current detecting step of detecting a value of a current flowing in the secondary battery; a calculating step of calculating an equivalent circuit component that constitutes an equivalent circuit of the secondary battery; an estimating step of estimating a value of a voltage drop caused by a value of a dark current on the basis of the value of the dark current and the equivalent circuit component, the value of the dark current corresponding to a value of a current detected in the current detecting step and the dark current flowing in the secondary battery after the vehicle has stopped, and the equivalent circuit component corresponding to the equivalent circuit component calculated in the calculating step and having an element value varying nonlinearly in accordance with the value of the dark current; and a state detecting step of detecting a state of the secondary battery on the basis of the value of the voltage drop estimated in the estimating step.

According to this method, states of a variety of types of secondary batteries can be accurately detected even in a low-current range.

Advantageous Effects of Invention

According to the present invention, a secondary battery state detecting device and a secondary battery state detecting method capable of accurately detecting a state of a variety of types of secondary batteries, even in low-current range, can be provided.

DESCRIPTION OF EMBODIMENTS

Embodiments of the present invention will be described below.

(A) Configuration of First Embodiment

Figure 1:
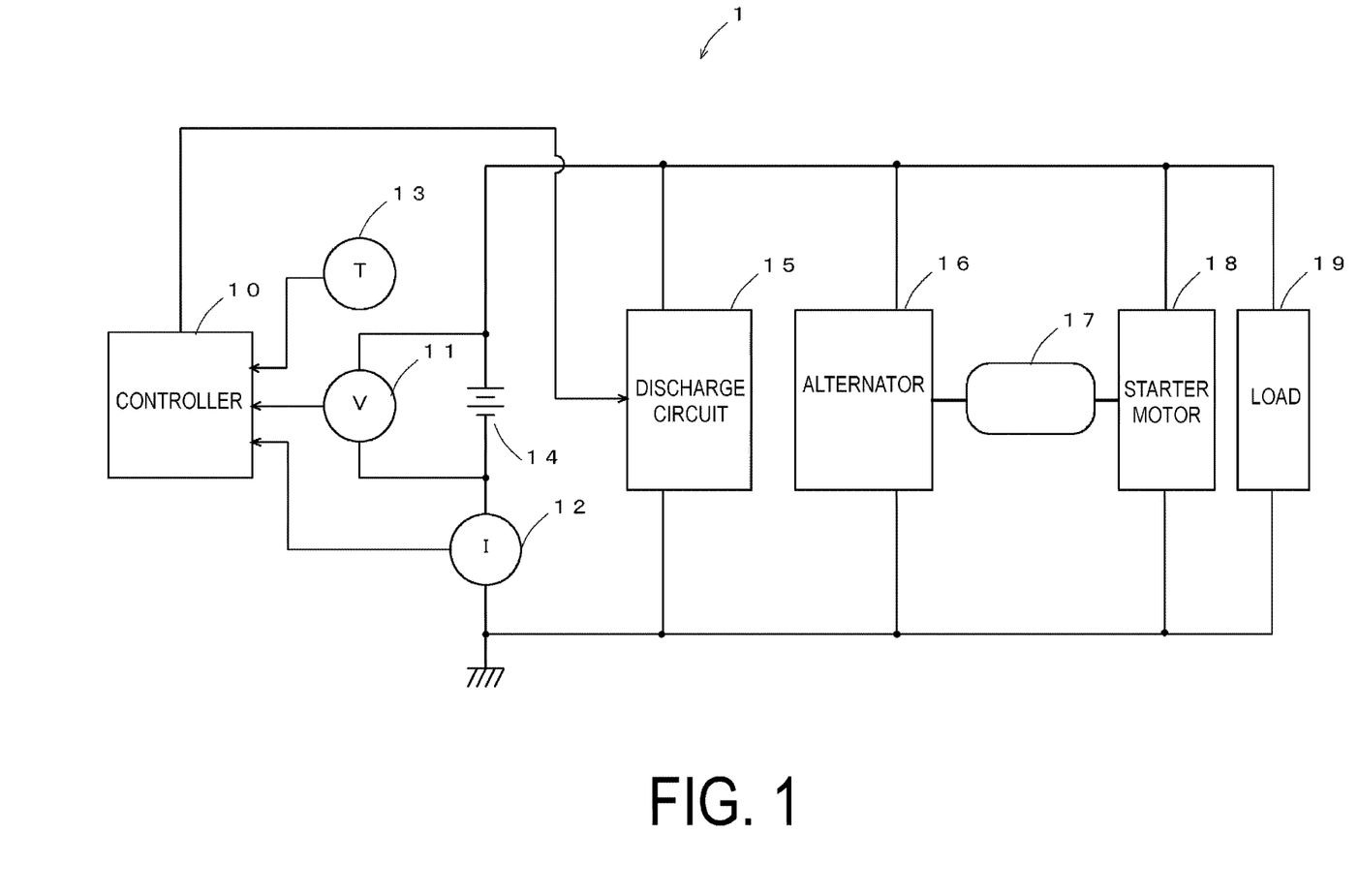
FIG. 1 is a diagram illustrating an example of the configuration of a secondary battery state detecting device according to an embodiment of the present invention.

FIG. 1 is a diagram illustrating a vehicle power supply system equipped with a secondary battery state detecting device according to a first embodiment of the present invention. In this diagram, a secondary battery state detecting device 1 includes a controller 10, a voltage sensor 11, a current sensor 12, a temperature sensor 13, and a discharge circuit 15 as primary constituent elements, and detects a state of a secondary battery 14. Here, the controller 10 detects the state of the secondary battery 14 by referring to outputs from the voltage sensor 11, the current sensor 12, and the temperature sensor 13. The voltage sensor 11 detects a terminal voltage of the secondary battery 14 and sends the result to the controller 10. The current sensor 12 detects a current flowing in the secondary battery 14 and sends the result to the controller 10. The temperature sensor 13 detects the temperature of the secondary battery 14 itself or the ambient temperature therearound and sends the result to the controller 10. The discharge circuit 15, which is constituted of, for example, a semiconductor switch, a resistance element, and the like connected in series, intermittently discharges the secondary battery 14 through on/off control of the semiconductor switch performed by the controller 10.

The secondary battery 14, which is constituted of, for example, a lead-acid battery, a nickel-cadmium battery, a nickel-metal hydride battery, a lithium-ion battery, or the like, is charged by an alternator 16. In addition, the secondary battery 14 drives a starter motor 18 to start an engine and supplies electric power to a load 19. The alternator 16 is driven by the engine 17 to generate AC power that is converted to DC power by a rectifier circuit; the secondary battery 14 is then charged with the DC power.

The engine 17 is a reciprocating engine such as a petrol engine or a diesel engine, or a rotary engine. The engine 17 is started by the starter motor 18 and drives drive wheels via a transmission to supply propulsive power to the vehicle. The engine 17 also drives the alternator 16 to generate electric power. The starter motor 18, which is, for example, a DC motor, generates a rotational force using electric power supplied from the secondary battery 14 to start the engine 17. Examples of the load 19 include an electric power steering motor, a defogger, an ignition coil, a car audio system, and a car navigation system, which run on electric power from the secondary battery 14. Note that an electric motor may be used instead of the engine 17.

Figure 2:
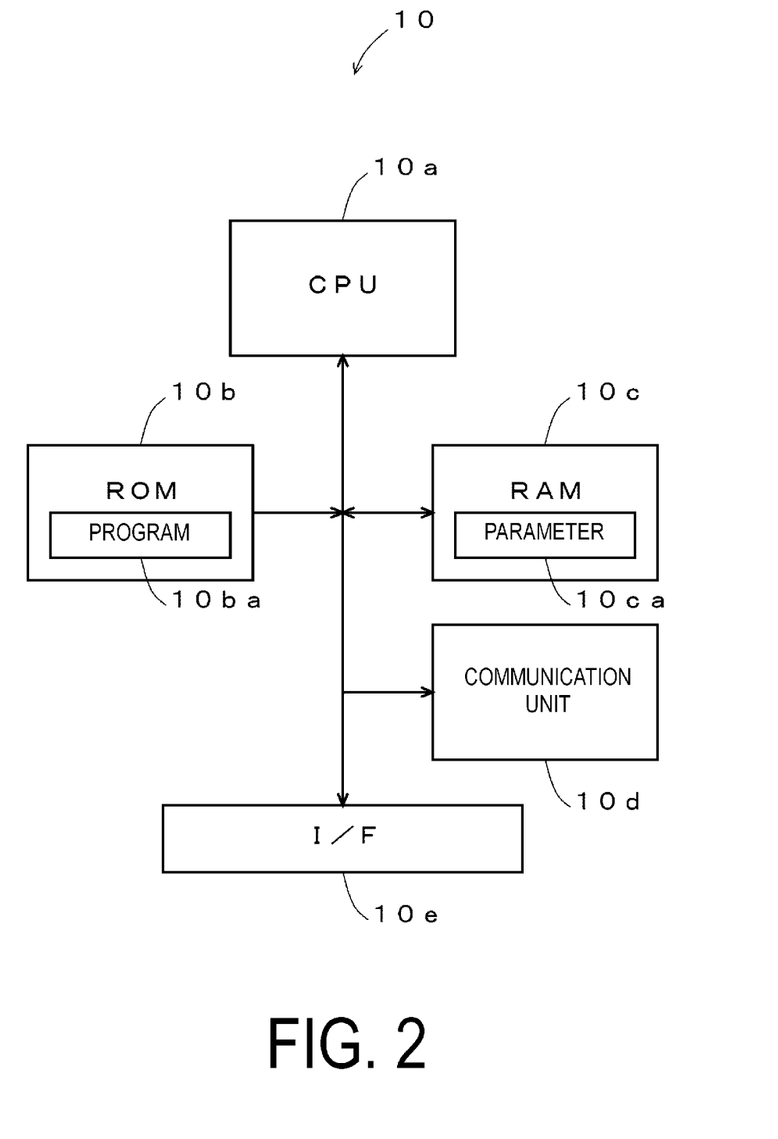
FIG. 2 is a block diagram illustrating, in detail, an example of the configuration of a controller illustrated in FIG. 1.

FIG. 2 is a diagram illustrating, in detail, an example of the configuration of the controller 10 illustrated in FIG. 1. As illustrated in FIG. 2, the controller 10 includes a central processing unit (CPU) 10*a*, a read-only memory (ROM) 10*b*, a random access memory (RAM) 10*c*, a communication unit 10*d*, and an interface (I/F) 10*e*. Here, the CPU 10*a* controls components according to a program 10*ba* stored in the ROM 10*b*. The ROM 10*b*, which is, for example, a semiconductor memory, stores the program 10*ba* and the like. The RAM 10*c*, which is, for example, a semiconductor memory, stores data generated when executing the program ba, a parameter 10*ca* such as a mathematical expression which will be described later, and the like. The communication unit 10*d* communicates with an electronic control unit (ECU), which is an upper device, to send detected information to the upper device. The I/F 10*e* converts signals supplied from the voltage sensor 11, the current sensor 12, and the temperature sensor 13 into digital signals and imports the resulting signals, and furthermore supplies a driving current to the discharge circuit 15 and carries out control thereof.

Figure 3:
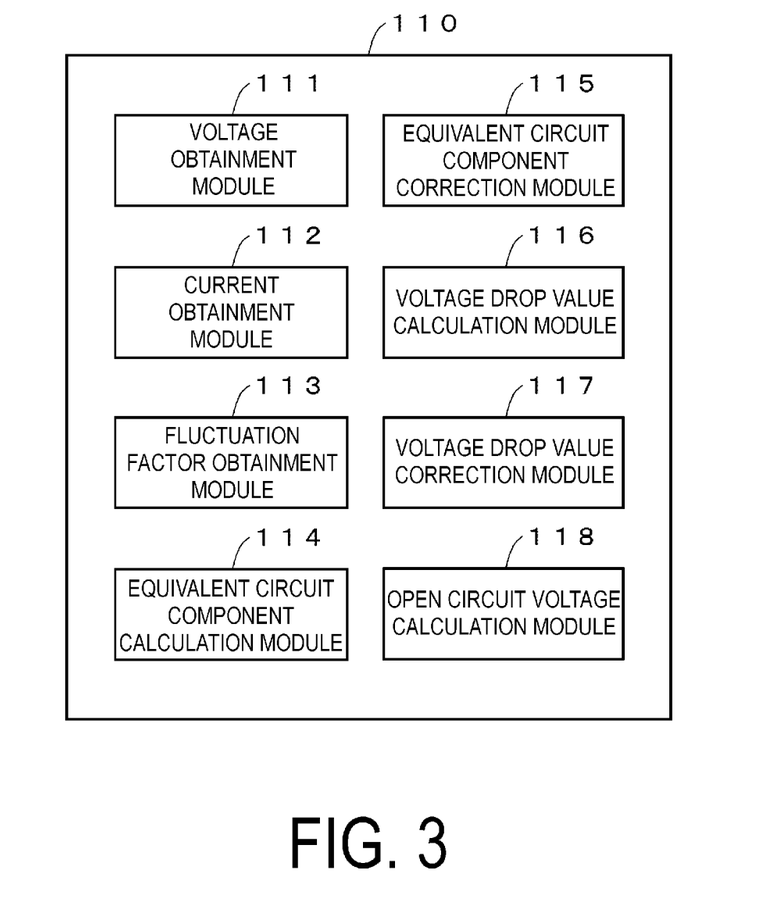
FIG. 3 is a diagram illustrating an example of a module implemented by hardware and software working cooperatively in the case where the program illustrated in FIG. 2 has been executed.

FIG. 3 is a diagram illustrating a processing module 110 implemented by software and hardware working cooperatively in the case where the program 10*ba* illustrated in FIG. 2 has been executed. As illustrated in FIG. 3, the processing module 110 includes a voltage obtainment module 111, a current obtainment module 112, a fluctuation factor obtainment module 113, an equivalent circuit component calculation module 114, an equivalent circuit component correction module 115, a voltage drop value calculation module 116, a voltage drop value correction module 117, and an open circuit voltage calculation module 118.

Figure 4:
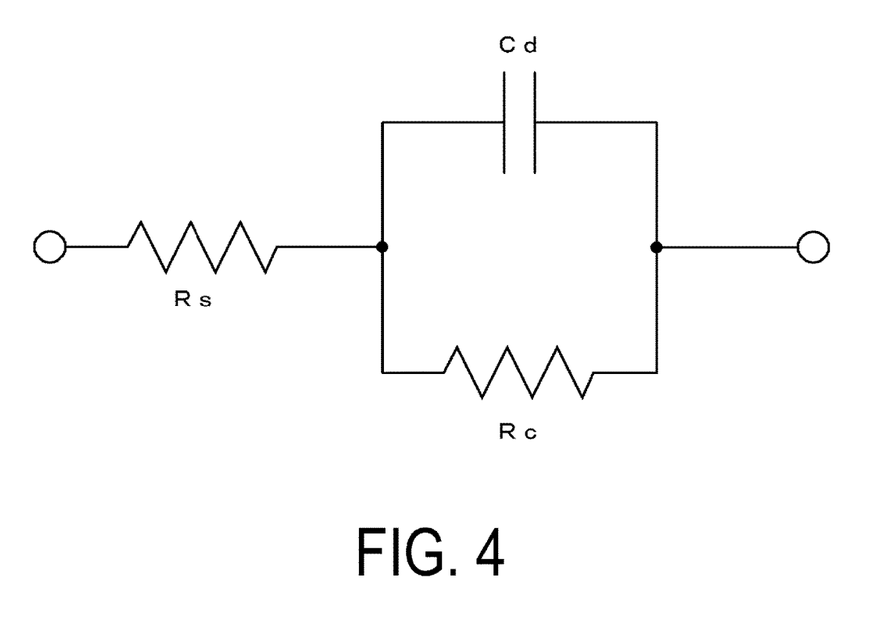
FIG. 4 is a diagram illustrating an example of an equivalent circuit of a secondary battery.

Here, the voltage obtainment module 111 obtains a value of the terminal voltage of the secondary battery 14 detected by the voltage sensor 11. The current obtainment module 112 obtains a value of the current flowing in the secondary battery 14 detected by the current sensor 12. The fluctuation factor obtainment module 113 obtains a temperature, a state of charge, and a stratification voltage, which are fluctuation factors with respect to the state of the secondary battery 14. The equivalent circuit component calculation module 114 calculates an equivalent circuit component of the secondary battery 14. Note that an equivalent circuit in which an electric double layer capacity Cd and a reaction resistance Rc are connected in parallel and a conductive resistance Rs is connected in series, as illustrated in FIG. 4 for example, can be used as the equivalent circuit of the secondary battery 14. The equivalent circuit component calculation module 114 calculates element values of the electric double layer capacity Cd, the reaction resistance Rc, and the conductive resistance Rs, which serve as the equivalent circuit components that constitute the equivalent circuit illustrated in FIG. 4.

The equivalent circuit component correction module 115 corrects each equivalent circuit component on the basis of the fluctuation factors obtained by the fluctuation factor obtainment module 113. The voltage drop value calculation module 116 calculates a voltage drop value on the basis of the equivalent circuit components calculated by the equivalent circuit component calculation module 114 or the equivalent circuit components corrected by the equivalent circuit component correction module 115. The voltage drop value correction module 117 corrects the voltage drop value calculated by the voltage drop value calculation module 116 on the basis of the fluctuation factors obtained by the fluctuation factor obtainment module 113. The open circuit voltage calculation module 118 calculates an open circuit voltage of the secondary battery 14 on the basis of the voltage drop value calculated by the voltage drop value calculation module 116 or the voltage drop value corrected by the voltage drop value correction module 117.

(B) Description of Operations of First Embodiment

Next, the operations of the first embodiment will be described. When the vehicle is stopped and the engine 17 is stopped, the operations of the electric power steering motor, the defogger, the ignition coil, the car audio system, the car navigation system, and the like, which are examples of the load 19, are stopped, and only a clock, a car security system, the secondary battery state detecting device, and the like remain in operation. Accordingly, a current flowing from the secondary battery 14 to the load 19 is only a weak current (a current of approximately several mA to several hundred mA), which is known as a dark current. At this time, upon a set amount of time (one hour, for example) passing after the vehicle engine 17 was stopped and the current flowing from the secondary battery 14 to the load 19 dropping below a predetermined threshold value (less than several hundred mA, for example), the CPU 10*a* determines that the engine 17 is stopped and a dark current is flowing, and measures an open circuit voltage OCV of the secondary battery 14, as described below, in order to estimate a state of the secondary battery 14.

Figure 5:
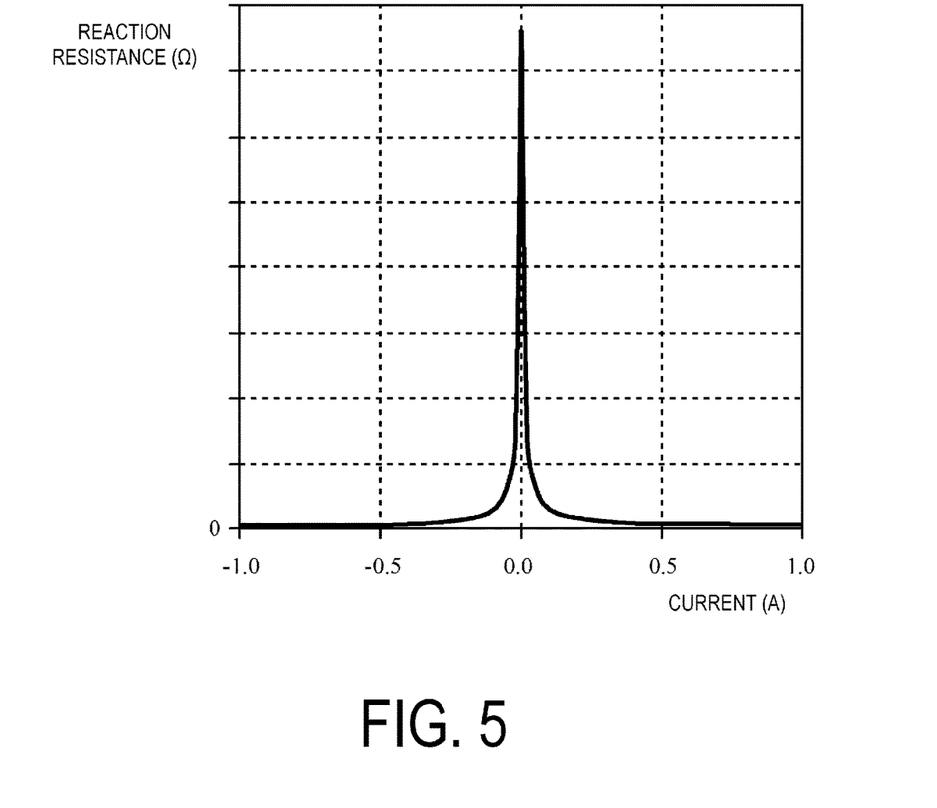
FIG. 5 is a graph illustrating a relationship between a current of a secondary battery and an element value of a reaction resistance when a weak current flows.

Incidentally, in a state where a weak current such as a dark current is flowing, the element value of the reaction resistance, which is one of the equivalent circuit components of the secondary battery 14, increases greatly in a nonlinear manner in response to variations in current, as indicated in FIG. 5.

Figure 6:
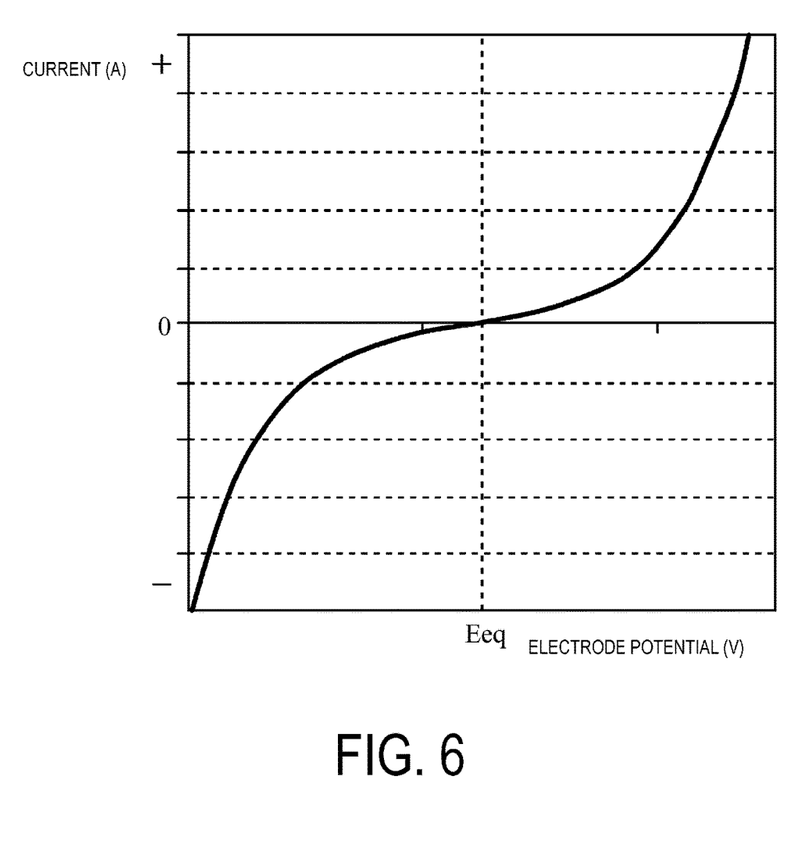
FIG. 6 is a graph illustrating a relationship between a current of a secondary battery and an electrode potential when a weak current flows.

To be more specific, when the current flowing in the secondary battery 14 varies, the electrode potential of the secondary battery 14 varies greatly in a nonlinear manner in response to variations in the current, particularly in low-current range, as illustrated in FIG. 6. Note that in FIG. 6, a minus sign for the current indicates discharging, whereas a plus sign indicates charging. Further, Eeq indicates an equilibrium potential where the current value becomes 0 A. Furthermore, as illustrated in FIG. 5, the value of the reaction resistance is specifically large near 0 in a range where the current is weak. Here, the reaction resistance refers to the resistance component indicated by Rc in the case where the secondary battery 14 is represented as an equivalent circuit such as that illustrated in FIG. 4. Note that in FIG. 4, Rs represents the conductive resistance and Cd represents the electric double layer capacity.

In the present embodiment, in the case where the engine 17 has stopped and dark current is flowing, the circuit open voltage OCV is found taking into consideration a nonlinear relationship between potential and current in the secondary battery and the unique characteristics in the low-current range, as illustrated in FIGS. 5 and 6. Having done so, an accurate circuit open voltage OCV that takes into consideration the nonlinear behavior is found, and the state of the secondary battery 14 is estimated on the basis of the open circuit voltage OCV that has been found.

Figure 7:
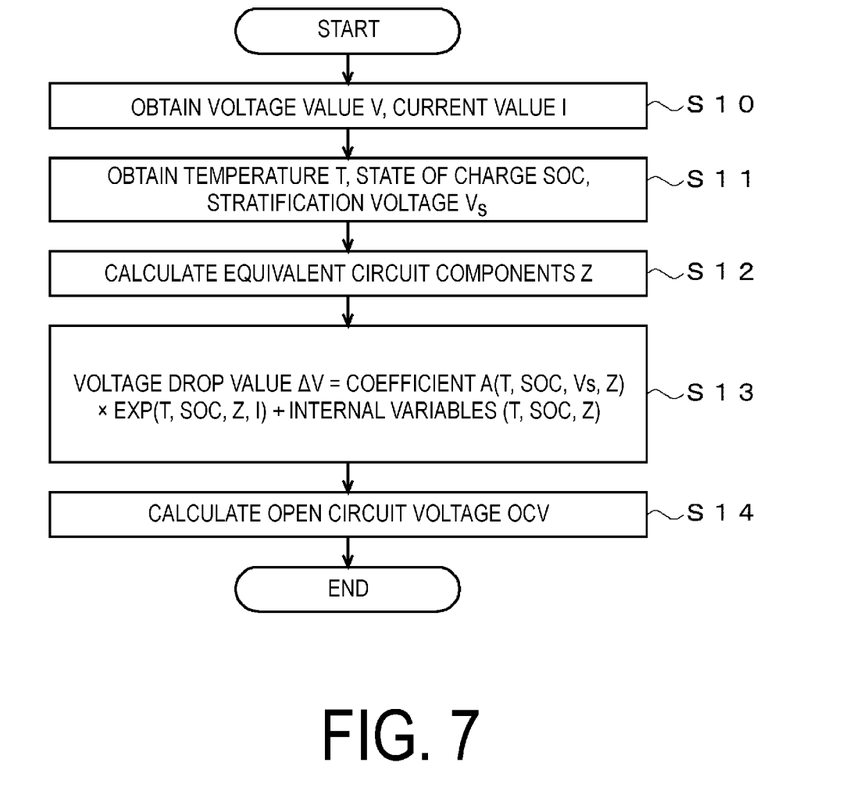
FIG. 7 illustrates an example of a flowchart for describing operations of a first embodiment.

Details of these operations will be given with reference to the flowchart illustrated in FIG. 7. The flowchart illustrated in FIG. 7 is started and the following steps are executed in the case where the vehicle has been stopped, the engine 17 has been stopped, and a set amount of time (one hour, for example) has passed, and furthermore the current flowing from the secondary battery 14 to the load 19 is less than a predetermined threshold value (less than several hundred mA, for example).

In step S10, the voltage obtainment module 111 obtains a voltage value V of the secondary battery 14 detected by the voltage sensor 11, and the current obtainment module 112 obtains a current value I of the current flowing in the secondary battery 14 detected by the current sensor 12.

In step S11, the fluctuation factor obtainment module 113 obtains a temperature T, a state of charge SOC, and a stratification voltage Vs, which are fluctuation factors with respect to the state of the secondary battery 14. To be more specific, the fluctuation factor obtainment module 113 obtains the temperature T of the secondary battery 14 from the output of the temperature sensor 13. Further, the fluctuation factor obtainment module 113 obtains the SOC from a value obtained by totaling the current flowing in the secondary battery 14, for example. Furthermore, the fluctuation factor obtainment module 113 calculates the stratification voltage of the secondary battery 14 from a charge capacity and a discharge capacity present while the vehicle is traveling. Of course, the above-described SOC and stratification voltage may be obtained through other methods as well.

In step S12, the discharge circuit 15 causes the secondary battery 14 to discharge in pulses, for example; the equivalent circuit component calculation module 114 detects the voltage and current, and finds the element values of the equivalent circuit components Z illustrated in FIG. 4 (the conductive resistance Rs, the reaction resistance Rc, and the electric double layer capacity Cd element values) on the basis of the detected voltage and current. Note that examples of a method for finding the equivalent circuit components through a learning process using a Kalman filter, a support vector machine, or the like include a method for finding the equivalent circuit components.

In step S13, the voltage drop value calculation module 116 calculates a voltage drop value $\Delta V$ caused by the equivalent circuit components Z when the current I flows in the secondary battery 14. Specifically, the voltage drop value $\Delta V$ is calculated on the basis of the following Formula (1). Note that a coefficient A(T, SOC, Vs, Z) represents a coefficient determined by the temperature T, the state of charge SOC, the stratification voltage Vs, and the equivalent circuit components Z; EXP(T, SOC, Z, I) represents an exponential function that takes the temperature T, the state of charge SOC, the equivalent circuit components Z, and the current I as parameters; and internal variables (T, SOC, Z) represents an offset component determined by the temperature T, the state of charge SOC, and the equivalent circuit components Z.

$$\Delta V = \text{coefficient } A(T, SOC, Vs, Z) \times \text{EXP}(T, SOC, Z, I) + \text{internal variables}(T, SOC, Z) \quad (1)$$

Figure 8:
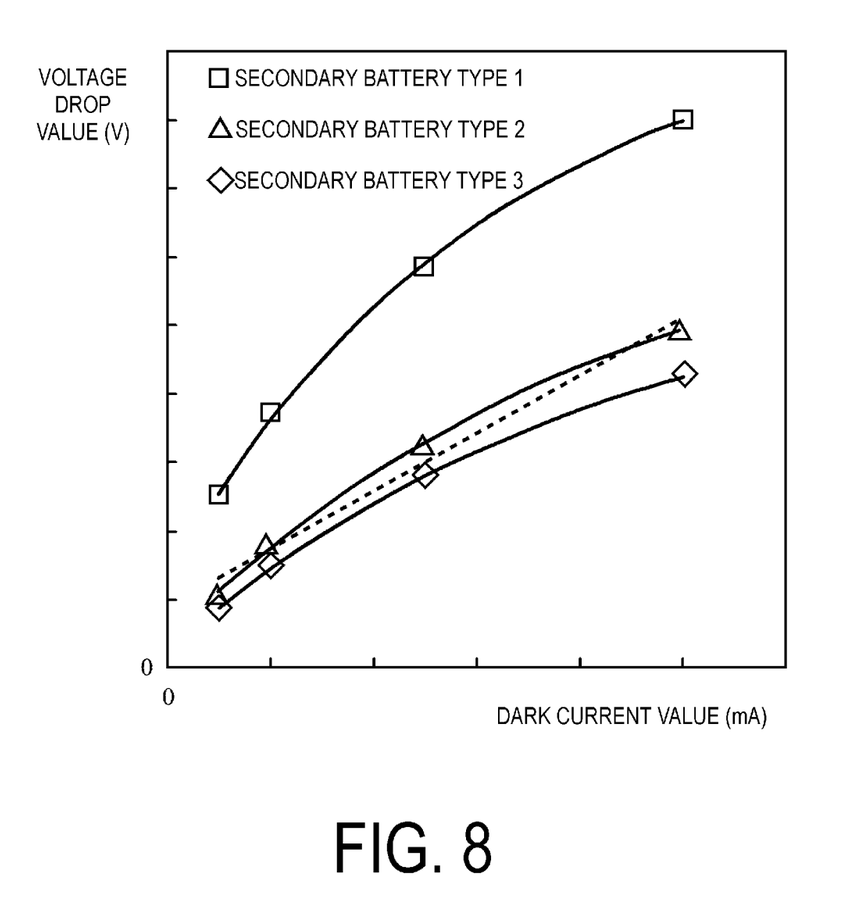
FIG. 8 is a graph illustrating a relationship between a dark current value and a voltage drop value according to the first embodiment.

According to Formula (1), the voltage drop value $\Delta V$ is determined by the exponential function of the current I, and thus the two are in a nonlinear relationship. As such, the characteristics whereby the voltage varies in a nonlinear manner in response to variations in the current, as illustrated in FIGS. 5 and 6, can be reflected. FIG. 8 is a diagram for comparing the results of measuring the respective relationships between the voltage drop value $\Delta V$ and the value of dark current flowing in three different types of secondary batteries 14, in a state where the temperature of the secondary battery 14 is 25° C. and the SOC is 100%. In FIG. 8, the squares, triangles, and diamonds indicate actual measurement results for the respective three types of secondary batteries, and the solid lines represent results of estimations for the respective types of secondary batteries using the aforementioned Formula (1). As illustrated in FIG. 8, the relationship between the dark current value and the voltage drop value differs depending on the type of the secondary battery 14 (for example, the capacity, the battery size, the manufacturer, and the charge state). Furthermore, the respective actual measurement results (squares, triangles, and diamonds) and the estimation results (the solid lines) match closely, which proves that Formula (1) accurately expresses the different voltage drops $\Delta V$ for the different types of secondary batteries 14. Note that the dashed line in FIG. 8 represents a result of estimating the relationship between the dark current value and the voltage drop value $\Delta V$ for secondary battery type 2 using a primary expression that takes the temperature and the SOC as variables. It can be seen that in the case where the voltage drop $\Delta V$ is estimated using a primary expression that takes only the temperature and the SOC as parameters, the voltage drop $\Delta V$ diverges not only from the actual measurement values of the secondary battery types 1 and 3 (squares and diamonds) that are different from the estimated type 2, but also from the actual measurement value of the type 2 to be estimated (triangles).

In step S14, the open circuit voltage calculation module 118 finds the open circuit voltage OCV from the voltage drop $\Delta V$ found in step S13.

The open circuit voltage OCV can be found through the processing described thus far. The state of the secondary battery 14 can be obtained with accuracy by using the open circuit voltage OCV found in this manner.

As described thus far, according to the first embodiment of the present invention, the voltage drop value $\Delta V$ of the secondary battery 14 is calculated on the basis of Formula (1), which takes into consideration the nonlinearity of the equivalent circuit components Z; accordingly, even in a state where, for example, a weak current is flowing after the engine 17 of the vehicle has been stopped, the voltage drop value $\Delta V$ of the secondary battery 14 can be calculated accurately, and thus the open circuit voltage OCV can be found accurately. Through this, the state of the secondary battery 14 can be detected accurately in a vehicle stopped state where a dark current is flowing.

In addition, according to the first embodiment, the equivalent circuit components of the secondary battery 14 in question are calculated on the basis of actual measurements in step S12, and the voltage drop value $\Delta V$ is calculated in step S13 on the basis of Formula (1), which includes fluctuation factors for the secondary battery 14, such as the temperature T, the state of charge SOC, and the stratification voltage Vs, as parameters; accordingly, the states of a variety of types of the secondary batteries 14 can be detected with accuracy.

(C) Description of Second Embodiment

Figure 9:
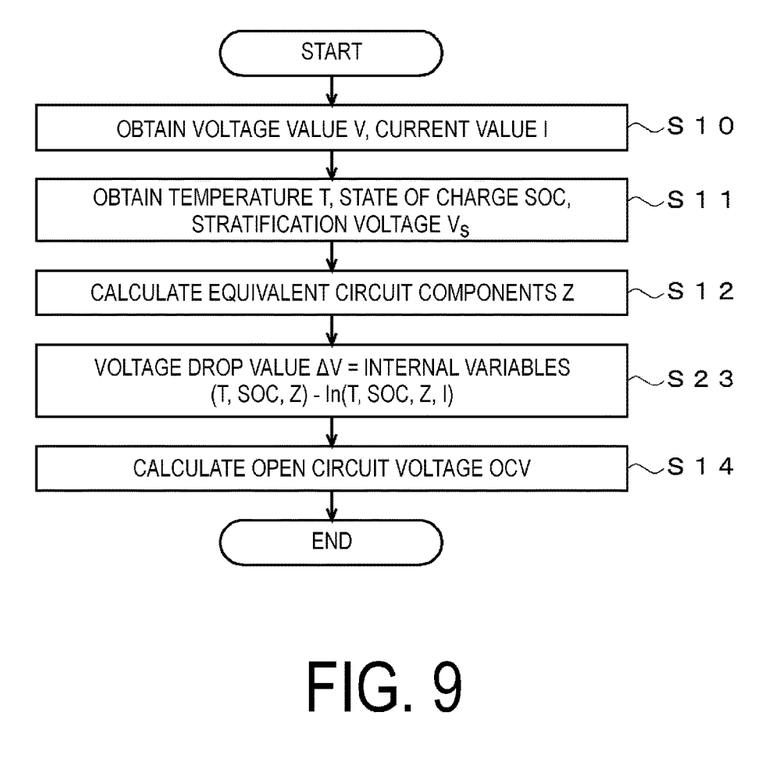
FIG. 9 illustrates an example of a flowchart for describing operations of a second embodiment.

A second embodiment of the present invention will be described next. Compared to the first embodiment, the second embodiment has the same configuration as that illustrated in FIGS. 1 to 3, but the processing executed by the controller 10 is different. FIG. 9 is a flowchart illustrating an example of a flow of processing executed in the second embodiment. Note that in FIG. 9, parts that correspond to those in FIG. 7 will be given the same reference numerals and descriptions thereof will be omitted. Compared to FIG. 7, the process of step S13 has been replaced with step S23 in FIG. 9. The rest is the same as in FIG. 7. Accordingly, the following descriptions will focus on step S23.

When the processing illustrated in FIG. 9 is started, the voltage value I and the current value V are detected in step S10, the temperature T, the state of charge SOC, and the stratification voltage Vs are obtained in step S11, the equivalent circuit components Z are calculated in step S12, and the voltage drop value $\Delta V$ is calculated on the basis of the following Formula (2) in step S23. Here, the internal variables (T, SOC, and Z) are the same as in Formula (1). Further, ln(T, SOC, Z, I) represents a logarithmic function that take the temperature T, the state of charge SOC, the equivalent circuit components Z, and the current I as parameters. Note that the coefficient A(T, SOC, Vs, Z) is not included in Formula (2).

$$\Delta V = \text{internal variables } (T, SOC, Z) - \ln (T, SOC, Z, I) \quad (2)$$

Once the voltage drop value $\Delta V$ is calculated in step S23, the open circuit voltage OCV is calculated on the basis of the voltage drop value $\Delta V$.

According to the second embodiment, the current I and the voltage drop value $\Delta V$ are found on the basis of a formula including a logarithmic function, and thus by taking the nonlinearity of the equivalent circuit components Z into consideration, the voltage drop value $\Delta V$ of the secondary battery 14 can be calculated accurately even in the case where a weak current, such as a dark current, is flowing. In addition, according to the second embodiment, the equivalent circuit components of the secondary battery 14 in question are calculated on the basis of actual measurements in step S12, and the voltage drop value $\Delta V$ is calculated in step S23 on the basis of Formula (2), which includes fluctuation factors for the secondary battery 14, such as the temperature T, the state of charge SOC, and the stratification voltage Vs, as parameters; accordingly, the states of a variety of types of the secondary batteries 14 can be detected with accuracy.

(D) Description of Alternate Embodiment

It goes without saying that the embodiments described above are merely examples, and that the present invention is not limited to the embodiments described above. For example, although Formula (1) includes the coefficient A(T, SOC, Vs) in the above-described first embodiment, Formula (1) need not include this coefficient. In addition, although Formula (2) does not include the coefficient A(T, SOC, Vs), Formula (2) may include this coefficient. Likewise, the internal variables (T, SOC, Z) need not be included in Formula (1) and Formula (2).

In addition, although the equivalent circuit components Z calculated in step S12 are used as-is in the above-described embodiments, the equivalent circuit components Z calculated in step S12 may be corrected on the basis of the fluctuation factors of the temperature T, the state of charge SOC, and the stratification voltage Vs, for example. Specifically, the equivalent circuit components Z calculated by the equivalent circuit component calculation module 114 in step S12 can be corrected by the equivalent circuit component correction module 115 on the basis of the fluctuation factors obtained by the fluctuation factor obtainment module 113. As a correction method, the calculated equivalent circuit components can be corrected using a correction table, for example, so as to correspond to a reference temperature (25° C., for example), a reference state of charge (100%, for example), and a reference stratification voltage (0 V, for example), for example.

In addition, although the voltage drop value $\Delta V$ calculated in step S13 or step S23 as-is are used in the above-described embodiments, the voltage drop value $\Delta V$ may be corrected in accordance with the fluctuation factors in the same manner as the equivalent circuit components as described above. Specifically, the voltage drop value $\Delta V$ calculated by the voltage drop value calculation module 116 in step S13 or step S23 can be corrected by the voltage drop value correction module 117 on the basis of the fluctuation factors obtained by the fluctuation factor obtainment module 113. As a correction method, the calculated voltage drop value $\Delta V$ can be corrected using a correction table, for example, so as to correspond to a reference temperature (25° C., for example), a reference state of charge (100%, for example), and a reference stratification voltage (0 V, for example), for example. Note that such a voltage drop value correction and an equivalent circuit component correction may both be executed.

Furthermore, although all of the components indicated in FIG. 4 are used as the equivalent circuit components in each of the above-described embodiments, any desired combination thereof may be used instead, for example. For example, it is possible to use only the reaction resistance Rc, or use only the reaction resistance Rc and the conductive resistance Rs. Needless to say, other combinations are possible as well.

REFERENCE SIGNS LIST

1 Secondary battery state detecting device
10 Controller
10a CPU
10b ROM
10c RAM
10d Communication unit
10e I/F
11 Voltage sensor
12 Current sensor
13 Temperature sensor
14 Secondary battery
15 Discharge circuit
16 Alternator
17 Engine
18 Starter motor
19 Load
111 Voltage obtainment module
112 Current obtainment module
113 Fluctuation factor obtainment module
114 Equivalent circuit component calculation module (calculating means)
115 Equivalent circuit component correction module
116 Voltage drop value calculation module (estimating means)

117 Voltage drop value correction module
118 Open circuit voltage calculation module (detecting means)

The invention claimed is:

1. A secondary battery state detecting device, the device comprising:
one or more programmable processors connected to a voltage detector detecting a voltage of a secondary battery installed in a vehicle and to a current detector detecting a current flowing in the secondary battery, the one or more processors being programmed to perform at least the following:
determining a current value of the current flowing in the secondary battery;
determining an equivalent circuit for a circuit comprising the secondary battery based on the voltage and the current, wherein the equivalent circuit comprises at least one equivalent circuit component;
estimating a voltage drop value of a voltage drop caused by a dark current based on an exponential function or a logarithmic function associated with a dark current value of the dark current that flows in the secondary battery when the vehicle is in an off state, a value of the at least one equivalent circuit component, and a temperature value of a temperature of the secondary battery; and
detecting a state of the secondary battery installed in the vehicle based on the voltage drop value.

2. The secondary battery state detecting device according to claim 1, wherein the one or more processors are further programmed to perform at least the following:
communicating with an electric control unit; and
notifying the electric control unit of detected information for the detecting the state of the secondary battery.

3. The secondary battery state detecting device according to claim 1, wherein the equivalent circuit component includes at least one of a reaction resistance and a conductive resistance.

4. The secondary battery state detecting device according to claim 1, wherein the equivalent circuit component is adapted based on a fluctuation factor of the secondary battery.

5. The secondary battery state detecting device according to claim 1, wherein the estimating the voltage drop value results in an adjusted voltage drop value based on adjusting the voltage drop value according to a fluctuation factor of the secondary battery.

6. The secondary battery state detecting device according to claim 5, wherein the detecting comprises detecting the state of the secondary battery installed in the vehicle based on the adjusted voltage drop value.

7. The secondary battery state detecting device according to claim 1, wherein the secondary battery is subject to a fluctuation factor, and wherein the fluctuation factor is based on at least one of a change in the temperature, a change in charge state, and a change in a stratification voltage of the secondary battery.

8. The secondary battery state detecting device according to claim 1, wherein the estimating the voltage drop value of the voltage drop is based on multiplying a first value by the exponential function and adding an offset value, wherein the first value is based on the temperature, a state of charge, a stratification voltage, and the equivalent circuit, wherein the exponential function is a function of the temperature, the state of charge, and the equivalent circuit, and wherein the offset value is based on the temperature, the state of charge, and the equivalent circuit.

9. The secondary battery state detecting device according to claim 1, wherein the estimating the voltage drop value of the voltage drop is based on subtracting a value of the logarithmic function from a first value, wherein the first value is based on the temperature, a state of charge, and the equivalent circuit, and wherein the logarithmic function is a function of the temperature, the state of charge, the equivalent circuit, and the current value.

10. The secondary battery state detecting device according to claim 1, wherein the estimating the voltage drop value provides improved accuracy for the detecting the state of the secondary battery installed in the vehicle.

11. The secondary battery state detecting device according to claim 1, wherein the one or more processors are further programmed to perform at least the following:
outputting information for the detecting the state of the secondary battery to an electronic control unit, wherein the electronic control unit controls the vehicle based on the information.

12. A device comprising:
a processor; and
a memory that stores executable instructions that, when executed by the processor, facilitate performance of operations, comprising:
in response to determining a first current value of a current flowing in a battery in a first operational state, calculating an equivalent circuit for a circuit comprising the battery in the first operational state;
estimating a voltage drop value of a voltage drop caused by a dark current, wherein the dark current corresponds to a different current flowing in the battery in a second operational state that is different than the first operational state, and wherein the voltage drop value is estimated based on an exponential function associated with a second current value of the dark current flowing in the battery in the second operational state as a first parameter of the exponential function, a value of the equivalent circuit as a second parameter of the exponential function, and a temperature value of a temperature of the battery as a third parameter of the exponential function; and
detecting a state of the battery based on the voltage drop value.

13. The device of claim 12, wherein a modeled behavior of a nonlinear element associated with the equivalent circuit is adapted based on a fluctuation factor of the battery.

14. The device of claim 12, wherein the voltage drop value is adjusted, resulting in an adjusted voltage drop value, based on the voltage drop value and a fluctuation factor of the battery.

15. A device comprising:
a processor; and
a memory that stores executable instructions that, when executed by the processor, facilitate performance of operations, comprising:
in response to determining a first current value of a current flowing in a battery in a first operational state, calculating an equivalent circuit for a circuit comprising the battery;
estimating a voltage drop value of a voltage drop caused by a dark current, wherein the dark current corresponds to a different current flowing in the battery in a second operational state different from the first operational state, and wherein the voltage drop value is estimated based on a logarithmic function associated with a second current value of the dark current flowing in the battery in the second operational state as a first parameter of the logarithmic function, a value of the equivalent circuit as a second parameter of the logarithmic function, and a temperature value of a temperature of the battery as a third parameter of the logarithmic function; and detecting a state of the battery based on the voltage drop value.

16. The device of claim 15, wherein the voltage drop value is adjusted, resulting in an adjusted voltage drop value, based on the voltage drop value and a fluctuation factor of the battery.

17. The device of claim 15, wherein a modeled behavior of a nonlinear element associated with the equivalent circuit is adapted based on a fluctuation factor of the battery.

18. The device of claim 15, wherein the equivalent circuit component comprises a current limiting resistor.

19. The device of claim 18, wherein the equivalent circuit component comprises a capacitor in series with the current limiting resistor, or a reaction resistor in series with the current limiting resistor.

20. A method comprising:

detecting, by a system comprising a processor, a current value of a current flowing in a battery of a vehicle in an on state;

calculating, by the system, an equivalent circuit component of an equivalent circuit to a circuit comprising the battery;

estimating, by the system and based on an exponential function or a logarithmic function associated with a dark current value of a dark current that flows in the battery during an off state of the vehicle, a value of the equivalent circuit component, and a temperature value of a temperature of the battery, a voltage drop value of a voltage drop caused by the dark current; and determining, by the system, a state of the battery on the basis of the value of the voltage drop.

* * * * *